US00RE47088E

(19) United States
(12) Reissued Patent
Lai et al.

(10) Patent Number: US RE47,088 E
(45) Date of Reissued Patent: Oct. 16, 2018

(54) NITRIDE SEMICONDUCTOR STRUCTURE AND SEMICONDUCTOR LIGHT EMITTING DEVICE INCLUDING THE SAME

(71) Applicant: Genesis Photonics Inc., Tainan (TW)

(72) Inventors: Yen-Lin Lai, New Taipei (TW); Jyun-De Wu, Tainan (TW); Yu-Chu Li, Chiayi (TW)

(73) Assignee: Genesis Photonics Inc., Tainan (TW)

(21) Appl. No.: 15/721,675

(22) Filed: Sep. 29, 2017

Related U.S. Patent Documents

Reissue of:
(64) Patent No.: 9,147,800
Issued: Sep. 29, 2015
Appl. No.: 13/963,127
Filed: Aug. 9, 2013

(30) Foreign Application Priority Data

Nov. 19, 2012 (TW) ..... 101143153 A

(51) Int. Cl.
*H01L 29/06* (2006.01)
*H01L 33/06* (2010.01)
(Continued)

(52) U.S. Cl.
CPC ..... *H01L 33/06* (2013.01); *H01L 33/14* (2013.01); *H01L 33/32* (2013.01)

(58) Field of Classification Search
CPC ..... H01L 33/06; H01L 33/14; H01L 33/32; H01L 51/56; H01L 2227/323;
(Continued)

(56) References Cited

U.S. PATENT DOCUMENTS 6,278,054 B1 * 8/2001 Ho et al. ..... 136/256
7,326,963 B2 * 2/2008 Gaska ..... B82Y 20/00 257/79
(Continued)

FOREIGN PATENT DOCUMENTS

CN 101073160 11/2007
CN 101645480 2/2010
(Continued)

OTHER PUBLICATIONS

"Office Action of US Related Application, U.S. Appl. No. 14/257,012", dated Nov. 16, 2017, p. 1-p. 13, in which the listed references were cited.
(Continued)

*Primary Examiner* — Tuan H Nguyen
(74) *Attorney, Agent, or Firm* — JCIPRNET

(57) ABSTRACT

A nitride semiconductor structure and a semiconductor light emitting device are revealed. The semiconductor light emitting device includes a substrate disposed with a first type doped semiconductor layer and a second type doped semiconductor layer. A light emitting layer is disposed between the first type doped semiconductor layer and the second type doped semiconductor layer. The second type doped semiconductor layer is doped with a second type dopant at a concentration larger than $5\times10^{19}$ $cm^{-3}$ while a thickness of the second type doped semiconductor layer is smaller than 30 nm. Thereby the semiconductor light emitting device provides a better light emitting efficiency.

31 Claims, 2 Drawing Sheets

(51) Int. Cl.
*H01L 33/14* (2010.01)
*H01L 33/32* (2010.01)

(58) Field of Classification Search
CPC ..... H01L 27/124; H01L 27/1259; H01L 27/3276; H01L 27/1225; H01L 27/3258; H01L 2933/0033; H01L 29/7869; H01L 33/24; H01L 33/36; H01L 33/486
USPC ..... 257/13, 40, 77, 201, 194, 473, 615; 438/220, 575, 655
See application file for complete search history.

(56) References Cited

U.S. PATENT DOCUMENTS

| | | | | |
|---|---|---|---|---|
| 8,304,793 | B2 | 11/2012 | Yoshizumi et al. | |
| 8,872,157 | B2 * | 10/2014 | Wu | H01L 33/14 257/13 |
| 9,219,189 | B2 * | 12/2015 | Northrup | H01L 33/0025 |
| 2003/0006418 | A1 | 1/2003 | Emerson et al. | |
| 2003/0085409 | A1 | 5/2003 | Shen et al. | |
| 2004/0264533 | A1 | 12/2004 | Matsumura et al. | |
| 2005/0127391 | A1 * | 6/2005 | Yanamoto | 257/103 |
| 2005/0224781 | A1 | 10/2005 | Kneissl et al. | |
| 2005/0224835 | A1 | 10/2005 | Nomura et al. | |
| 2006/0118820 | A1 | 6/2006 | Gaska et al. | |
| 2006/0175600 | A1 * | 8/2006 | Sato et al. | 257/14 |
| 2007/0096077 | A1 | 5/2007 | Sanga et al. | |
| 2007/0181869 | A1 | 8/2007 | Gaska et al. | |
| 2010/0142576 | A1 | 6/2010 | Cohen et al. | |
| 2011/0012089 | A1 | 1/2011 | Khan et al. | |
| 2011/0114916 | A1 | 5/2011 | Yoshizumi et al. | |
| 2011/0147763 | A1 * | 6/2011 | Hanawa et al. | 257/76 |
| 2012/0217473 | A1 | 8/2012 | Shur et al. | |
| 2013/0161586 | A1 | 6/2013 | Okuno et al. | |
| 2014/0183446 | A1 | 7/2014 | Nago et al. | |

FOREIGN PATENT DOCUMENTS

| | | | |
|---|---|---|---|
| CN | 101645480 | A | 2/2010 |
| CN | 101684549 | | 3/2010 |
| CN | 101944480 | | 1/2011 |
| CN | 102130425 | | 7/2011 |
| CN | 102214739 | | 10/2011 |
| CN | 102214739 | A | 10/2011 |
| CN | 102881784 | | 1/2013 |
| JP | H09321389 | | 12/1997 |
| JP | 2000196143 | | 7/2000 |
| JP | 2008034658 | | 2/2008 |
| JP | 2009016452 | | 1/2009 |
| JP | 2009152448 | | 7/2009 |
| JP | 2010263140 | | 11/2010 |
| JP | 2014103384 | | 6/2014 |
| TW | 402735 | | 8/2000 |
| TW | 451504 | | 8/2001 |
| TW | 200908393 | | 2/2009 |
| TW | 201011952 | | 3/2010 |
| TW | 201135967 | | 10/2011 |
| WO | 2007013257 | | 2/2007 |

OTHER PUBLICATIONS

"Office Action of Taiwan Related Application, application No. 105143135", dated Dec. 25, 2017, p. 1-p. 5, in which the listed references were cited.
"Office Action of Taiwan Related Application, application No. 106140004", dated Feb. 5, 2018, p. 1-p. 5, in which the listed reference was cited.
"Office Action of China Related Application No. 201710029565.6", dated Jul. 20, 2018, pp. 1-8.
"Office Action of Taiwan Related Application No. 107115825", dated Jul. 26, 2018, pp. 1-3.
"Office Action of Japan Related Application No. 2015156949", dated Jun. 5, 2018, pp. 1-10.
"Office Action of Related U.S. Appl. No. 15/723,117", dated Jul. 12, 2018, pp. 1-24.
"Office Action of Related U.S. Appl. No. 15/981,864", dated Jul. 16, 2018, pp. 1-21.
"Notice of Allowance of Related U.S. Appl. No. 15/627,419", dated Jul. 20, 2018, pp. 1-25.
"Notice of Allowance of Related U.S. Appl. No. 15/627,417", dated Jul. 19, 2018, pp. 1-22.
"Office Action of Taiwan Counterpart Application", issued on Sep. 29, 2014, p. 1-p. 5.

* cited by examiner

NITRIDE SEMICONDUCTOR STRUCTURE AND SEMICONDUCTOR LIGHT EMITTING DEVICE INCLUDING THE SAME

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

*CROSS-REFERENCE TO RELATED APPLICATION*

*This application is a Reissue Application of U.S. Pat. No. 9,147,800 issued on Sep. 29, 2015, application Ser. No. 13/963,127, filed on Aug. 9, 2013, which claims the priority benefit of Taiwan application No. 101143153, filed on Nov. 19, 2012. The entirety of each of the above-mentioned patent applications is hereby incorporated by reference herein and made a part of this specification.*

BACKGROUND OF THE INVENTION

1. Field of the Invention

The present invention relates to a nitride semiconductor structure and a semiconductor light emitting device, especially to a nitride semiconductor structure and a semiconductor light emitting device including a second type doped semiconductor layer with a high dopant concentration (larger than $5\times10^{19}$ $cm^{-3}$) and a small thickness (smaller than 30 nm) to improve a light-extraction efficiency and make the semiconductor light emitting device have a better light emitting efficiency.

2. Description of Related Art

Generally, a nitride light emitting diode is produced by forming a buffer layer on a substrate first. Then a n-type semiconductor layer, a light emitting layer and a p-type semiconductor layer are formed on the buffer layer in turn by epitaxial growth. Next use photolithography and etching processes to remove a part of the p-type semiconductor layer and a part of the light emitting layer until a part of the n-type semiconductor layer is exposed. Later a n-type electrode and a p-type electrode are respectively formed on the exposed n-type semiconductor layer and the p-type semiconductor layer. Thus a light emitting diode device is produced. The light emitting layer has a multiple quantum well (MQW) structure formed by a plurality of well layers and barrier layers disposed alternately. The band gap of the well layer is lower than that of the barrier layer so that electrons and holes are confined by each well layer of the MQW structure. Thus electrons and holes are respectively injected from the n-type semiconductor layer and the p-type semiconductor layer to be combined with each other in the well layers and photons are emitted.

The brightness of LED is determined by an internal quantum efficiency and a light-extraction efficiency. The internal quantum efficiency (IQE) is the ratio of electron hole pairs involved in radiation recombination to the injected electron hole pairs. The refractive index of air and GaN respectively is 1 and 2.4. According to total internal reflection equation, the critical angle of GaN LED that allows light to be emitted into air is about 24 degrees. Thus the light-extraction rate is about 4.34%. Due to total internal reflection of GaN and air, light emitting from LED is restricted inside the LED and the light-extraction rate is quite low. Thus many researches focus on improvement of the light-extraction efficiency. For example, one of the methods is to perform surface treatments on a p-type GaN layer for reducing the total internal reflection and further improving the light-extraction efficiency. The surface treatment includes surface roughening and changes of LED morphology. Another method is to separate the n-type GaN layer from the substrate and a rough structure is formed over the n-type GaN layer. Then the GaN semiconductor layer is attached to the substrate by glue for improving the light-extraction efficiency. However, the first method can only be used to treat an exposed p-type GaN semiconductor layer on top of the LED chip. Thus the improvement of the light-extraction efficiency has a certain limit. The process of the second method is quite complicated and the glue has a problem of poor heat dissipation. Therefore the light emitting efficiency of LED produced by the above two methods is unable to be increased effectively.

Moreover, the concentration of the dopant in the p-type GaN layer is unable to be increased effectively so that the resistance of the p-type GaN layer is quite large. Thus current is unable to be spread evenly in the p-type GaN layer when the current flows from metal electrodes to the GaN semiconductor layer. The uneven current spreading results in that the lighting area is confined under the metal electrodes (n-type electrode ad p-type electrode). The light emitting efficiency of LED is also decreased significantly.

In order to overcome the above shortcomings of the nitride semiconductor structure and the semiconductor light emitting device available now, there is a need to provide a novel nitride semiconductor structure and a new semiconductor light emitting device.

SUMMARY OF THE INVENTION

Therefore it is a primary object of the present invention to provide a nitride semiconductor structure in which a second type doped semiconductor layer has a high concentration of a second type dopant (larger than $5\times10^{19}$ $cm^{-3}$) and a thickness that is smaller than 30 nm so as to improve the light-extraction efficiency.

It is another object of the present invention to provide a semiconductor light emitting device including the above nitride semiconductor structure for providing a good light emitting efficiency.

In order to achieve the above objects, a nitride semiconductor structure mainly includes a first type doped semiconductor layer, a second type doped semiconductor layer, and a light emitting layer disposed between the first type doped semiconductor layer and the second type doped semiconductor layer. The second type doped semiconductor layer is doped with a second type dopant (magnesium is preferred) at a concentration larger than $5\times10^{19}$ $cm^{-3}$ and having a thickness smaller than 30 nm. The second type doped semiconductor layer is formed under relatively high pressure (larger than 300 torr).

Moreover, a hole supply layer is disposed between the light emitting layer and the second type doped semiconductor layer. The hole supply layer is made of $Al_xIn_yGa_{1-x-y}N$ while x and y satisfy the conditions: $0<x<1$, $0<y<1$, and $0<x+y<1$. The hole supply layer is doped with a second type dopant at a concentration larger than $10^{18}$ $cm^{-3}$. The hole supply layer is also doped with a Group IV-A element at a concentration ranging from $10^{17}$ $cm^{-3}$ to $10^{20}$ $cm^{-3}$ so that more holes are provided to enter the light emitting layer and the electron-hole recombination is further increased. The light emitting layer has a multiple quantum well (MQW)

structure. The band gap of the hole supply layer is larger than that of the well layer of the MQW structure so that holes in the hole supply layer can enter the well layer of the MQW structure. Thus the electron-hole recombination rate is increased and the light emitting efficiency is further improved.

As to the light emitting layer in the multiple quantum well (MQW) structure, the MQW structure includes a plurality of well layers and barrier layers stacked alternately while there is one well layer between every two barrier layers. The barrier layer is made of $Al_xIn_yGa_{1-x-y}N$, wherein x and y satisfy the conditions: $0<x<1$, $0<y<1$, and $0<x+y<1$. The well layer is made of $In_zGa_{1-z}N$ ($0<z<1$). The thickness of the well layer is ranging from 3.5 nm to 7 nm and the barrier layer is doped with a first type dopant at a concentration ranging from $10^{16}$ $cm^{-3}$ to $10^{18}$ $cm^{-3}$.

Furthermore, a second type carrier blocking layer made of $Al_xGa_{1-x}N$ ($0<x<1$) is disposed between the hole supply layer and the second type doped semiconductor layer while a first type carrier blocking layer made of $Al_xGa_{1-x}N$ ($0<x<1$) is disposed between the light emitting layer and the first type doped semiconductor layer. Due to the property that the band gap of AlGaN containing aluminum is larger than the band gap of GaN, carriers are confined in the MQW structure and electron-hole recombination rate is improved. Thus the light emitting efficiency is increased.

A semiconductor light emitting device of the present invention includes the above nitride semiconductor structure disposed on a substrate, a first type electrode and the second type electrode used together for providing electric power. Due to smaller thickness of the second type doped semiconductor layer, the second type electrode is getting closer to the surface of the light emitting layer. Thus a stronger coupling is generated due to resonance between photons from the light emitting layer and surface plasmon. Therefore the light emitting efficiency is improved. Moreover, the second type doped semiconductor layer has a higher concentration of the second type dopant than that of the conventional p-type GaN layer so that the resistance of the second type doped semiconductor layer is lower. Thus even current spreading in the second type doped semiconductor layer is achieved when the current flows from the second type electrode to the first type electrode. Therefore the LED gets a better light emitting efficiency.

BRIEF DESCRIPTION OF THE DRAWINGS

The structure and the technical means adopted by the present invention to achieve the above and other objects can be best understood by referring to the following detailed description of the preferred embodiments and the accompanying drawings, wherein.

DETAILED DESCRIPTION OF THE PREFERRED EMBODIMENT

In the following embodiments, when it is mentioned that a layer of something or a structure is disposed over or under a substrate, another layer of something, or another structure, that means the two structures, the layers of something, the layer of something and the substrate, or the structure and the substrate can be directly or indirectly connected. The indirect connection means there is at least one intermediate layer disposed therebetween.

Figure 1:
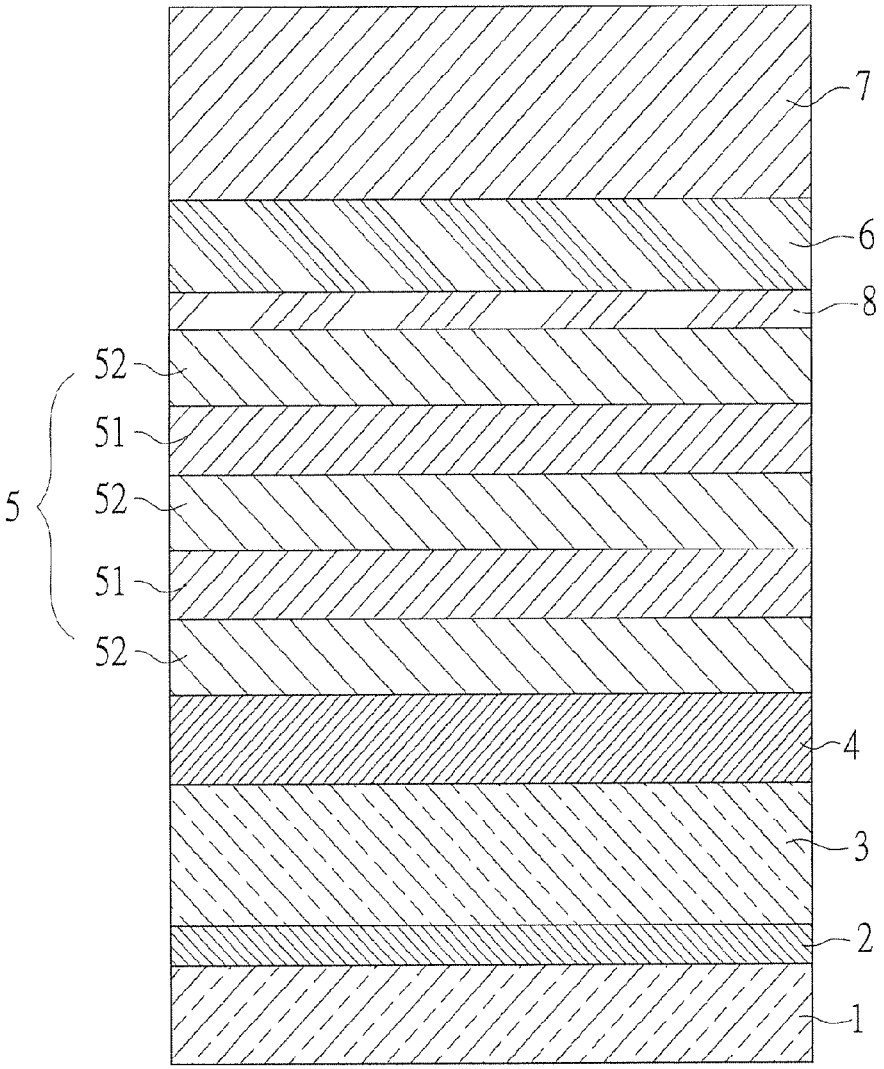
FIG. 1 is a schematic drawing showing a cross section of an embodiment of a nitride semiconductor structure according to the present invention.

Referring to FIG. 1, a cross section of an embodiment of nitride semiconductor structure according to the present invention is revealed. The nitride semiconductor structure includes a first type doped semiconductor layer 3 and a second type doped semiconductor layer 7. A light emitting layer 5 is disposed between the first type doped semiconductor layer 3 and the second type doped semiconductor layer 7. The second type doped semiconductor layer 7 is doped with a second type dopant at a concentration larger than $5\times10^{19}$ $cm^{-3}$ while a thickness of the second type doped semiconductor layer is smaller than 30 mm. The second dopant can be magnesium or zinc while magnesium is preferred.

Moreover, the first type doped semiconductor layer 3 is made of Si-doped or Ge-doped GaN based materials (n-type doped GaN based semiconductor layer) and the second type doped semiconductor layer 7 is made of Mg-doped GaN based materials (p-type doped GaN based semiconductor layer). The concentration of the Mg doped is larger than $5\times10^{19}$ $cm^{-3}$. The materials are not limited to the above ones. The first type doped semiconductor layer 3 and the second type doped semiconductor layer 7 are produced by metalorganic chemical vapor deposition (MOCVD) while the second type doped semiconductor layer 7 is formed under relatively higher pressure (larger than 300 torr).

Furthermore, a hole supply layer 8 is disposed between the light emitting layer 5 and the second type doped semiconductor layer 7. The hole supply layer 8 is made of $Al_xIn_yGa_{1-x-y}N$ ($0<x<1$, $0<y<1$, $0<x+y<1$) and is doped with a second dopant (such as Mg or Zn) at a concentration larger than $10^{18}$ $cm^{-3}$. Besides the second dopant, the hole supply layer 8 is also doped with a Group IV-A element (carbon is preferred) at a concentration ranging from $10^{17}$ to $10^{20}$ $cm^{-3}$. The pentavalent nitrogen atom is replaced by carbon (Group IV-A) so that there is one more positively charged hole. Thus the hole supply layer 8 has a higher concentration of holes and more holes are provided to enter the light emitting layer 5. Therefore the electron-hole recombination is further increased. As to the light emitting layer 5, it has a multiple quantum well (MQW) structure. The band gap of the hole supply layer 8 is larger than that of a well layer 51 of the MQW structure so that holes in the hole supply layer 8 can enter the well layer 51 of the MQW structure to increase the electron-hole recombination rate and further improve the light emitting efficiency.

In addition, for reducing stress caused by lattice mismatch between the well layer and the barrier layer of the MQW structure, the barrier layer 52 of the MQW structure is made of quaternary $Al_xIn_yGa_{1-x-y}N$ while x and y satisfy the conditions: $0<x<1$, $0<y<1$, and $0<x+y<1$. The well layer 51 is made of ternary $In_zGa_{1-z}N$ and $0<z<1$. Due to the property that both quaternary AlGaInN barrier layers and ternary InGaN well layers have the same element-indium, the quaternary composition can be adjusted and improved for providing a lattice matching composition. Thus the barrier layers and the well layers have closer lattice constant. The thickness of the well layer 51 is ranging from 3.5 nm to 7 nm. The barrier layer 52 is doped with a first type dopant (such as Si or Ge) at a concentration ranging from $10^{16}$ $cm^{-3}$ to $10^{18}$ $cm^{-3}$ so as to reduce carrier screening effect and increase carrier-confinement.

The above nitride semiconductor structure further includes a second type carrier blocking layer 6 disposed between the hole supply layer 8 and the second type doped semiconductor layer 7, and a first type carrier blocking layer 4 disposed between the light emitting layer 5 and the first type doped semiconductor layer 3. The second type carrier blocking layer 6 is made of $Al_xGa_{1-x}N$ (0<x<1) while the first type carrier blocking layer 4 is made of $Al_xGa_{1-x}N$ (0<x<1). Thereby carriers are confined in the MQW structure and the electron-hole recombination rate is increased due to the property that the band gap of AlGaN containing aluminum is larger than the band gap of GaN. Therefore the light emitting efficiency is increased.

Figure 2:
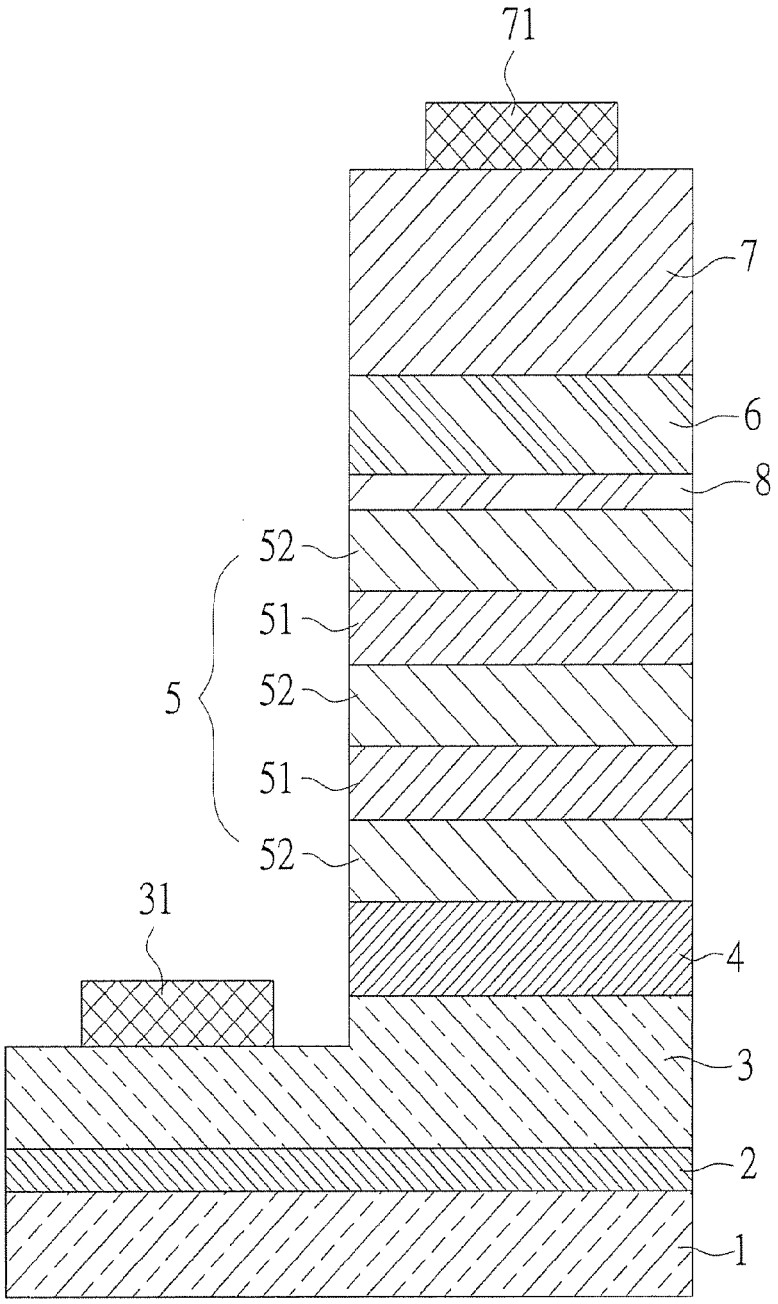
FIG. 2 is a schematic drawing showing a cross section of an embodiment of a semiconductor light emitting device including a nitride semiconductor structure according to the present invention.

The above nitride semiconductor structure is applied to semiconductor light emitting devices. Referring to FIG. 2, a cross sectional view of an embodiment of a semiconductor light emitting device is revealed. The semiconductor light emitting device at least includes: a substrate 1, a first type doped semiconductor layer 3 disposed over the substrate 1 and made of Si-doped or Ge-doped GaN based materials, a light emitting layer 5 disposed over the first type doped semiconductor layer 3, a second type doped semiconductor layer 7 disposed over the light emitting layer 5, a first type electrode 31 disposed on and in ohmic contact with the first type doped semiconductor layer 3, and a second type electrode 71 disposed on and in ohmic contact with the second type doped semiconductor layer 7.

The materials for the substrate 1 include sapphire, silicon, SiC, ZnO, GaN, etc. The second type doped semiconductor layer 7 is doped with a second type dopant at a concentration larger than $5\times10^{19}$ $cm^{-3}$ and having a thickness smaller than 30 nm. The first type electrode 31 and the second type electrode 71 are used together to provide electric power and are made of (but not limited to) the following materials: titanium, aluminum, gold, chromium, nickel, platinum, and their alloys. The manufacturing processes are well-known to people skilled in the art.

Moreover, a buffer layer 2 made of $Al_xGa_{1-x}N$ (0<x<1) is disposed between the substrate 1 and the first type doped semiconductor layer 3 and is used for improving lattice constant mismatch between the heterogeneous substrate 1 and the first type doped semiconductor layer 3 grown on the heterogeneous substrate 1. The buffer layer 2 is made of GaN, InGaN, SiC, ZnO, etc.

When using the above semiconductor light emitting device, the light-extraction efficiency is significantly improved and a better light emitting efficiency is achieved because that the second type doped semiconductor layer 7 is doped with high-concentration Magnesium (higher than $5\times10^{19}$ $cm^{-3}$) and is formed under relatively high pressure (larger than 300 torr) with a thickness smaller than 30 nmm that is thinner than conventional p-type GaN layer. The reasonable inference is that a stronger coupling is generated due to photons from the light emitting layer in resonance with surface plasmon when the second type electrode is getting closer to the surface of the light emitting layer. Thus the light emitting efficiency is increased. The surface plasmon resonance means free electrons fluctuations occurring on the surface of the second type electrode 71. Moreover, compared with the conventional p-type GaN layer, the second type doped semiconductor layer 7 has a higher concentration of the Mg dopant so that its resistance is relatively lower. Thus even current spreading is achieved when the current is flowing from the second type electrode 71 to the second type doped semiconductor layer 7. Therefore the light emitting diode gets a better light emitting efficiency.

Additional advantages and modifications will readily occur to those skilled in the art. Therefore, the invention in its broader aspects is not limited to the specific details, and representative devices shown and described herein. Accordingly, various modifications may be made without departing from the spirit or scope of the general inventive concept as defined by the appended claims and their equivalents.

What is claimed is:

1. A nitride semiconductor structure comprising:

a first type doped semiconductor layer, a second type doped semiconductor layer, a light emitting layer disposed between the first type doped semiconductor layer and the second type doped semiconductor layer;

a hole supply layer disposed between the light emitting layer and the second type doped semiconductor layer, wherein the hole supply layer is made of [$Al_{x1}In_{y1}Ga_{1-x1-y1}N$ (0<x1<1, 0<y1<1, and 0<x1+y1<1)] *GaN-based semiconductor comprising Al and In*; the hole supply layer is doped with a second type dopant at a concentration larger than $10^{18}$ $cm^{-3}$; and a second type carrier blocking layer disposed between the hole supply layer and the second type doped semiconductor layer, wherein the second type carrier blocking layer is made of [$Al_{x2}Ga_{1-x2}N$, wherein 0<x2<1] *GaN-based semiconductor comprising Al*;

wherein the second type doped semiconductor layer is doped with the second type dopant at a concentration larger than $5\times10^{19}$ $cm^{-3}$[and a thickness of the second type doped semiconductor layer is smaller than 30 nm].

2. The nitride semiconductor structure as claimed in claim 1, wherein the hole supply layer is doped with a Group IV-A element at a concentration ranging from $10^{17}$ $cm^{-3}$ to $10^{20}$ $cm^{-3}$.

3. The nitride semiconductor structure as claimed in claim 1, wherein the light emitting layer has a multiple quantum well (MQW) structure and a band gap of the hole supply layer is larger than a band gap of a well layer of the MQW structure.

4. The nitride semiconductor structure as claimed in claim 1, wherein the light emitting layer has a multiple quantum well (MQW) structure including a plurality well layers and barrier layers stacked alternately;

one of the well layers is disposed between every two barrier layers;

the barrier layer is made of [$Al_{x4}In_{y2}Ga_{1-x4-y2}N$ while x4 and y2 satisfy the conditions: 0<x4<1, 0<y2<1, and 0<x4+y2<1] *GaN-based semiconductor*; the well layer is made of [$In_zGa_{1-z}N$ (0<z<1)] *GaN-based semiconductor comprising In*.

5. The nitride semiconductor structure as claimed in claim 4, wherein a thickness of the well layer is ranging from 3.5 nm to 7 mm.

6. The nitride semiconductor structure as claimed in claim 4, wherein the barrier layer is doped with a first type dopant at a concentration ranging from $10^{16}$ $cm^{-3}$ to $10^{18}$ $cm^{-3}$.

7. The nitride semiconductor structure as claimed in claim 1, wherein a first type carrier blocking layer is disposed between the light emitting layer and the first type doped semiconductor layer; the first type carrier blocking layer is made of [$Al_{x3}Ga_{1-x3}N$, wherein 0<x3<1] *GaN-based semiconductor comprising Al*.

8. A semiconductor light emitting device comprising:

a substrate;

a first type doped semiconductor layer disposed over the substrate;

a first type carrier blocking layer disposed on the first type doped semiconductor layer, wherein the first type carrier blocking layer is made of [$Al_{x3}Ga_{1-x3}N$, where $0<x3<1$] *GaN-based semiconductor comprising Al*;

a light emitting layer disposed over the first type doped semiconductor layer;

a hole supply layer disposed on light emitting layer, wherein the hole supply layer is made of [$Al_{x1}In_{y1}Ga_{1-x1-y1}N$ where $0<x1<1$, $0<y1<1$, $0<x1+y1<1$] *GaN-based semiconductor comprising Al and In*;

a second type carrier blocking layer disposed on the hole supply layer, wherein the second type carrier blocking layer is made of [$Al_{x2}Ga_{1-x2}N$, wherein $0<x2<1$] *GaN-based semiconductor comprising Al*;

a second type doped semiconductor layer disposed over the light emitting layer, doped with a second type dopant at a concentration larger than $5\times10^{19}$ $cm^{-3}$[, and having a thickness smaller than 30 nm];

a first type electrode disposed on and in ohmic contact with the first type doped semiconductor layer[,]; and a second type electrode disposed on and in ohmic contact with the second type doped semiconductor layer.

9. The semiconductor light emitting device as claimed in claim 8, wherein the hole supply layer is doped with a Group IV-A element at a concentration ranging from $10^{17}$ $cm^{-3}$ to $10^{20}$ $cm^{-3}$.

10. The semiconductor light emitting device as claimed in claim 8, wherein the light emitting layer has a multiple quantum well (MQW) structure and a band gap of the hole supply layer is larger than a band gap of a well layer of the MQW structure.

11. The semiconductor light emitting device as claimed in claim 8, wherein the light emitting layer has a multiple quantum well (MQW) structure including a plurality well layers and barrier layers stacked alternately;

one of the well layers is disposed between every two barrier layers;

the barrier layer is made of [$Al_xIn_{y2}Ga_{1-x4-y2}N$ while x4 and y2 satisfy the conditions: $0<x4<1$, $0<y2<1$, and $0<x4+y2<1$] *GaN-based semiconductor*; the well layer is made of [$In_zGa_{1-z}N$ ($0<z<1$)] *GaN-based semiconductor comprising In*.

12. The semiconductor light emitting device as claimed in claim 11, wherein a thickness of the well layer is ranging from 3.5 nm to 7 nm.

13. The semiconductor light emitting device as claimed in claim 11, wherein the barrier layer is doped with a first type dopant at a concentration ranging from $10^{16}$ $cm^{-3}$ to $10^{18}$ $cm^{-3}$.

14. A nitride semiconductor structure comprising:

a first type doped semiconductor layer, a second type doped semiconductor layer, a light emitting layer disposed between the first type doped semiconductor layer and the second type doped semiconductor layer[,]; and a hole supply layer disposed between the light emitting layer and the second type doped semiconductor layer[,];

wherein the second type doped semiconductor layer is doped with a second type dopant at a concentration larger than $5\times10^{19}$ $cm^{-3}$[, a thickness of the second type doped semiconductor layer is smaller than 30 nm], and the hole supply layer is doped with a Group IV-A element.

15. The nitride semiconductor structure as claimed in claim 14, wherein the hole supply layer is made of [$Al_{x1}In_{y1}Ga_{1-x1-y1}N$ ($0<x1<1$, $0<y1<1$, and $0<x1+y1<1$)] *GaN-based semiconductor comprising Al and In*; the hole supply layer is doped with the second type dopant at a concentration larger than $10^{18}$ $cm^{-3}$.

16. The nitride semiconductor structure as claimed in claim 14, wherein the hole supply layer is doped with the Group IV-A element at a concentration ranging from $10^{17}$ $cm^{-3}$ to $10^{20}$ $cm^{-3}$.

17. The nitride semiconductor structure as claimed in claim 14, wherein the light emitting layer has a multiple quantum well (MQW) structure and a band gap of the hole supply layer is larger than a band gap of a well layer of the MQW structure.

18. The nitride semiconductor structure as claimed in claim 14, wherein the light emitting layer has a multiple quantum well (MQW) structure including a plurality well layers and barrier layers stacked alternately;

one of the well layers is disposed between every two barrier layers;

the barrier layer is made of [$Al_{x4}In_{y2}Ga_{1-x4-y2}N$ while x4 and y2 satisfy the conditions: $0<x4<1$, $0<y2<1$, and $0<x4+y2<1$] *GaN-based semiconductor*; the well layer is made of [$In_zGa_{1-z}N$ ($0<z<1$)] *GaN-based semiconductor comprising In*.

19. The nitride semiconductor structure as claimed in claim 18, wherein a thickness of the well layer is ranging from 3.5 nm to 7 nm.

20. The nitride semiconductor structure as claimed in claim 18, wherein the barrier layer is doped with a first type dopant at a concentration ranging from $10^{16}$ $cm^{-3}$ to $10^{18}$ $cm^{-3}$.

21. The nitride semiconductor structure as claimed in claim [16] *14*, wherein a second type carrier blocking layer is disposed between the hole supply layer and the second type doped semiconductor layer; the second type carrier blocking layer is made of [$Al_{x2}Ga_{1-x2}N$, wherein $0<x2<1$] *GaN-based semiconductor comprising Al*.

22. The nitride semiconductor structure as claimed in claim 14, wherein a first type carrier blocking layer is disposed between the light emitting layer and the first type doped semiconductor layer, the first type carrier blocking layer is made of [$Al_{x3}Ga_{1-x3}N$, wherein $0<x3<1$] *GaN-based semiconductor comprising Al*.

23. A semiconductor light emitting device comprising:

a substrate;

a first type doped semiconductor layer disposed over the substrate;

a light emitting layer disposed over the first type doped semiconductor layer;

a second type doped semiconductor layer disposed over the light emitting layer, doped with a second type dopant at a concentration larger than $5\times10^{19}$ $cm^{-3}$[, and having a thickness smaller than 30 nm];

a hole supply layer disposed between the light emitting layer and the second type doped semiconductor layer, wherein the hole supply layer is doped with a Group IV-A element;

a first type electrode disposed on and in ohmic contact with the first type doped semiconductor layer[,]; and a second type electrode disposed on and in ohmic contact with the second type doped semiconductor layer.

24. The [nitride semiconductor structure] *semiconductor light emitting device* as claimed in claim 23, wherein the hole supply layer is made of [$Al_{x1}In_{y1}Ga_{1-x1-y1}N$, wherein $0<x1<1$, $0<y1<1$, and $0<x1+y1<1$] *GaN-based semiconductor comprising Al and In*.

25. The [nitride semiconductor structure] *semiconductor light emitting device* as claimed in claim 23, wherein the hole supply layer is doped with the Group IV-A element at a concentration ranging from $10^{17}$ $cm^{-3}$ to $10^{20}$ $cm^{-3}$.

26. The [nitride semiconductor structure] *semiconductor light emitting device* as claimed in claim 23, wherein the light emitting layer has a multiple quantum well (MQW) structure and a band gap of the hole supply layer is larger than a band gap of a well layer of the MQW structure.

27. The [nitride semiconductor structure] *semiconductor light emitting device* as claimed in claim 23, wherein the light emitting layer has a multiple quantum well (MQW) structure including a plurality well layers and barrier layers stacked alternately;

one of the well layers is disposed between every two barrier layers;

the barrier layer is made of [$Al_{x4}In_{y2}Ga_{1-x4-y2}N$ while x4 and y2 satisfy the conditions: 0<x4<1, 0<y2<1, and 0<x4+y2<1] *GaN-based semiconductor*; the well layer is made of [$In_zGa_{1-z}N$, where 0<z<1] *GaN-based semiconductor comprising In*.

28. The [nitride semiconductor structure] *semiconductor light emitting device* as claimed in claim 27, wherein a thickness of the well layer is ranging from 3.5 nm to 7 nm.

29. The [nitride semiconductor structure] *semiconductor light emitting device* as claimed in claim 27, wherein the barrier layer is doped with a first type dopant at a concentration ranging from $10^{16}$ $cm^{-3}$ to $10^{18}$ $cm^{-3}$.

30. The [nitride semiconductor structure] *semiconductor light emitting device* as claimed in claim 23, wherein a second type carrier blocking layer is disposed between the hole supply layer and the second type doped semiconductor layer; the second type carrier blocking layer is made of [$Al_{x2}Ga_{1-x2}N$, wherein 0<x2<1] *GaN-based semiconductor comprising Al*.

31. The [nitride semiconductor structure] *semiconductor light emitting device* as claimed in claim 23, wherein a first type carrier blocking layer is disposed between the light emitting layer and the first type doped semiconductor layer, the first type carrier blocking layer is made of [$Al_{x3}Ga_{1-x3}N$, wherein 0<x3<1] *GaN-based semiconductor comprising Al*.

* * * * *